United States Patent
Fischer et al.

(10) Patent No.: US 9,548,186 B2
(45) Date of Patent: Jan. 17, 2017

(54) METHODS AND APPARATUS FOR DUAL CONFINEMENT AND ULTRA-HIGH PRESSURE IN AN ADJUSTABLE GAP PLASMA CHAMBER

(71) Applicant: Lam Research Corporation, Fremont, CA (US)

(72) Inventors: Andreas Fischer, Castro Valley, CA (US); Eric Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 316 days.

(21) Appl. No.: 14/495,553

(22) Filed: Sep. 24, 2014

(65) Prior Publication Data

US 2015/0011097 A1 Jan. 8, 2015

Related U.S. Application Data

(62) Division of application No. 12/368,843, filed on Feb. 10, 2009, now Pat. No. 8,869,741.

(Continued)

(51) Int. Cl.
*C23C 16/50* (2006.01)
*C23C 16/503* (2006.01)
(Continued)

(52) U.S. Cl.
CPC ...... *H01J 37/32091* (2013.01); *H01J 37/3299* (2013.01); *H01J 37/32449* (2013.01);
(Continued)

(58) Field of Classification Search
CPC ............. H01J 37/32091; H01J 37/32541; H01J 37/32816; H01J 37/32623; H01J 37/3299; H01J 37/32568; H01J 37/32642; H01J 37/32449; H01J 37/32532; H01L 21/3065
(Continued)

(56) References Cited

U.S. PATENT DOCUMENTS 5,000,113 A * 3/1991 Wang ............... C23C 16/402
118/715
5,089,442 A * 2/1992 Olmer ............... C23C 16/0272
204/192.12
(Continued)

FOREIGN PATENT DOCUMENTS

CN 100401451 7/2008
JP 02014517 A * 1/1990
(Continued)

OTHER PUBLICATIONS

Shahid Rauf e al. "Physics of Very High Frequency Capacitively Coupled Plasma Discharges" AVS 54$^{th}$ International Symposium, Oct. 15, 2007.
European Search Opinion from PCT Application No. 0908370887.0 from Oct. 30, 2015.
Japanese Office Action from Japanese Application No. 2011-542362 dated Jul. 28, 2015.
(Continued)

*Primary Examiner* — Rudy Zervigon
(74) *Attorney, Agent, or Firm* — Beyer Law Group LLP

(57) ABSTRACT

A plasma processing system having a plasma processing chamber configured for processing a substrate is provided. The plasma processing system includes at least an upper electrode and a lower electrode for processing the substrate. The substrate is disposed on the lower electrode during plasma processing, where the upper electrode and the substrate forms a first gap. The plasma processing system also includes an upper electrode peripheral extension (UE-PE). The UE-PE is mechanically coupled to a periphery of the upper electrode, where the UE-PE is configured to be non-coplanar with the upper electrode. The plasma processing system further includes a cover ring. The cover ring is
(Continued)

US 9,548,186 B2

Page 2 configured to concentrically surround the lower electrode, where the UE-PE and the cover ring forms a second gap.

16 Claims, 2 Drawing Sheets

Related U.S. Application Data

(60) Provisional application No. 61/139,481, filed on Dec. 19, 2008.

(51) Int. Cl.

| | | |
|---|---|---|
| C23C 16/505 | (2006.01) | |
| C23C 16/509 | (2006.01) | |
| H01L 21/306 | (2006.01) | |
| C23F 1/00 | (2006.01) | |
| H01J 37/32 | (2006.01) | |
| H01L 21/3065 | (2006.01) | |
| C23C 16/06 | (2006.01) | |
| C23C 16/22 | (2006.01) | |

(52) U.S. Cl.
CPC .. *H01J 37/32532* (2013.01); *H01J 37/32541* (2013.01); *H01J 37/32568* (2013.01); *H01J 37/32623* (2013.01); *H01J 37/32642* (2013.01); *H01J 37/32816* (2013.01); *H01L 21/3065* (2013.01)

(58) Field of Classification Search
USPC ........ 118/723 E, 723 R; 156/345.43, 345.44, 156/345.45, 345.47, 345.51
See application file for complete search history.

(56) References Cited

U.S. PATENT DOCUMENTS

| | | | | |
|---|---|---|---|---|
| 5,252,178 A * | 10/1993 | Moslehi | ............... | C23C 16/4405 118/50.1 |
| 5,556,500 A * | 9/1996 | Hasegawa | ......... | H01J 37/32623 156/345.27 |
| 5,766,364 A * | 6/1998 | Ishida | ............... | C23C 16/45565 118/715 |
| 5,779,803 A * | 7/1998 | Kurono | ............. | H01J 37/32633 118/723 E |
| 5,919,332 A * | 7/1999 | Koshiishi | ............ | C23C 16/5096 118/723 E |
| 6,074,518 A * | 6/2000 | Imafuku | ........... | H01J 37/32623 118/723 E |
| 6,096,161 A * | 8/2000 | Kim | .................. | H01J 37/32623 156/345.47 |
| 6,110,287 A * | 8/2000 | Arai | .................... | C23C 16/5096 118/723 E |
| 6,284,093 B1 | 9/2001 | Ke et al. | | |
| 6,391,787 B1 * | 5/2002 | Dhindsa | ............ | H01J 37/32009 118/723 R |
| 6,475,336 B1 * | 11/2002 | Hubacek | ............ | C23C 16/4585 118/723 E |
| 6,527,911 B1 * | 3/2003 | Yen | ................... | H01J 37/32623 118/723 E |
| 6,553,932 B2 * | 4/2003 | Liu | .................... | C23C 16/45565 118/723 E |
| 6,585,851 B1 * | 7/2003 | Ohmi | ................. | H01J 37/32082 118/723 E |
| 6,689,249 B2 * | 2/2004 | Ke | .................... | H01J 37/32623 118/504 |
| 6,744,212 B2 * | 6/2004 | Fischer | ............ | H01J 37/32082 118/723 E |
| 6,818,096 B2 * | 11/2004 | Barnes | ............... | H01J 37/32532 118/723 E |
| 6,823,815 B2 * | 11/2004 | Han | .................. | H01J 37/32623 118/723 E |
| 6,824,627 B2 * | 11/2004 | Dhindsa | ............ | H01J 37/32009 118/723 R |
| 6,828,243 B2 * | 12/2004 | Denpoh | .............. | C23C 16/4585 156/345.14 |
| 6,841,943 B2 * | 1/2005 | Vahedi | ............... | H01J 37/32165 118/723 I |
| 6,867,146 B2 * | 3/2005 | Arita | ................... | H01L 21/3065 257/E21.218 |
| 6,872,281 B1 * | 3/2005 | Chen | ................ | H01J 37/32082 118/723 E |
| 6,963,043 B2 * | 11/2005 | Fink | ................ | H01J 37/32642 118/723 R |
| 6,974,523 B2 * | 12/2005 | Benzing | ............ | H01J 37/32623 156/345.43 |
| 6,984,288 B2 * | 1/2006 | Dhindsa | ............ | H01J 37/32082 118/723 E |
| 7,316,761 B2 * | 1/2008 | Doan | ................ | H01J 37/32009 118/715 |
| 7,430,986 B2 * | 10/2008 | Dhindsa | ............ | H01J 37/32477 118/715 |
| 7,446,048 B2 * | 11/2008 | Oikawa | ............ | H01J 37/32082 156/345.25 |
| 7,482,550 B2 * | 1/2009 | Larson | ............. | H01J 37/32009 118/723 I |
| 7,572,737 B1 * | 8/2009 | Dhindsa | ............ | H01J 37/32642 216/68 |
| 7,578,258 B2 * | 8/2009 | Fischer | ............... | C23C 16/4404 118/723 E |
| 7,670,432 B2 * | 3/2010 | Li | ....................... | C23C 16/4412 118/715 |
| 7,691,277 B2 * | 4/2010 | Suzuki | ............. | H01L 21/67069 134/1 |
| 7,713,380 B2 * | 5/2010 | Chen | ................ | H01J 37/3244 118/723 R |
| 7,713,431 B2 * | 5/2010 | Ukei | ................. | C23C 16/4585 216/67 |
| 7,740,705 B2 * | 6/2010 | Li | ....................... | C23C 16/4412 118/715 |
| 7,758,718 B1 * | 7/2010 | Dine | ................ | C23C 16/509 118/723 I |
| 7,758,764 B2 * | 7/2010 | Dhindsa | ............ | H01J 37/32091 118/723 MP |
| 7,827,931 B2 * | 11/2010 | Matsushima | ........ | H01J 37/3244 118/723 E |
| 7,837,825 B2 * | 11/2010 | Fischer | ............ | H01J 37/32623 118/723 E |
| 7,837,827 B2 * | 11/2010 | Dhindsa | ............ | H01J 37/32091 156/345.51 |
| 7,854,820 B2 * | 12/2010 | De La Llera | ..... | H01J 37/32009 118/715 |
| 7,858,898 B2 * | 12/2010 | Bailey, III | ........ | H01J 37/32366 118/723 I |
| 7,861,667 B2 * | 1/2011 | Fischer | ............ | H01J 37/32541 118/723 E |
| 7,879,184 B2 * | 2/2011 | Hudson | ................ | B08B 7/0035 156/345.38 |
| 7,882,800 B2 * | 2/2011 | Koshiishi | ........... | H01J 37/32642 118/723 R |
| 7,939,778 B2 * | 5/2011 | Larson | ............. | H01J 37/32009 118/723 I |
| 7,943,007 B2 * | 5/2011 | Bailey, III | ........ | H01J 37/32366 156/345.47 |
| 7,951,261 B2 * | 5/2011 | Jeon | .................. | H01J 37/32532 118/715 |
| 8,012,306 B2 * | 9/2011 | Dhindsa | ............ | H01J 37/32082 118/723 E |
| 8,114,247 B2 * | 2/2012 | Endoh | ............... | H01J 37/32642 118/728 |
| 8,152,925 B2 * | 4/2012 | Iizuka | ............. | H01J 37/3244 118/715 |
| 8,161,906 B2 * | 4/2012 | Kadkhodayan | ... | H01J 37/32091 118/715 |
| 8,211,324 B2 * | 7/2012 | Dhindsa | ............ | H01J 37/32091 118/723 MP |
| 8,262,922 B2 * | 9/2012 | Dhindsa | ............ | H01J 37/32477 216/67 |

(56) References Cited

U.S. PATENT DOCUMENTS

| | | | | |
|---|---|---|---|---|
| 8,272,346 B2* | 9/2012 | Bettencourt | H01L 21/67069 | 118/723 E |
| 8,290,717 B2* | 10/2012 | Dhindsa | H01J 37/32449 | 438/706 |
| 8,313,612 B2* | 11/2012 | McMillin | H01J 37/32788 | 118/715 |
| 8,337,623 B2* | 12/2012 | Dhindsa | H01J 37/32082 | 134/1.1 |
| 8,449,679 B2* | 5/2013 | Dhindsa | H01J 37/32642 | 118/723 E |
| 8,485,128 B2* | 7/2013 | Kellogg | H01J 37/32 | 118/723 I |
| 8,500,953 B2* | 8/2013 | Chang | H01J 37/32623 | 156/345.43 |
| 8,522,715 B2* | 9/2013 | Fischer | C23C 16/45523 | 118/723 R |
| 8,540,844 B2* | 9/2013 | Hudson | H01J 37/32082 | 118/719 |
| 8,622,021 B2* | 1/2014 | Taylor | C04B 35/593 | 118/723 R |
| 8,628,675 B2* | 1/2014 | McMillin | H01J 37/32788 | 216/59 |
| 8,632,637 B2* | 1/2014 | Nishio | H01J 37/32082 | 134/1 |
| 8,869,741 B2* | 10/2014 | Fischer | H01J 37/32091 | 118/723 E |
| 2002/0129769 A1* | 9/2002 | Kim | C23C 16/45514 | 118/723 E |
| 2002/0187647 A1* | 12/2002 | Dhindsa | H01J 37/32009 | 438/710 |
| 2003/0029567 A1* | 2/2003 | Dhindsa | H01J 37/32082 | 156/345.47 |
| 2003/0151371 A1* | 8/2003 | Fischer | H01J 37/32082 | 315/111.21 |
| 2004/0035532 A1* | 2/2004 | Jung | H01J 37/32623 | 156/345.43 |
| 2004/0040931 A1* | 3/2004 | Koshiishi | H01J 37/32082 | 216/67 |
| 2004/0159401 A1* | 8/2004 | Miya | C23C 16/5096 | 156/345.24 |
| 2005/0005859 A1* | 1/2005 | Koshiishi | H01J 37/32642 | 118/728 |
| 2005/0106869 A1* | 5/2005 | Ooyabu | H01J 37/32477 | 438/689 |
| 2005/0133160 A1* | 6/2005 | Kennedy | C23C 16/45565 | 156/345.34 |
| 2005/0133164 A1* | 6/2005 | Fischer | H01J 37/32642 | 156/345.51 |
| 2006/0043067 A1* | 3/2006 | Kadkhodayan | C04B 35/505 | 216/67 |
| 2006/0225654 A1* | 10/2006 | Fink | C04B 30/02 | 118/723 R |
| 2006/0278340 A1 | 12/2006 | Fischer | | |
| 2007/0068900 A1* | 3/2007 | Kim | H01J 37/32357 | 216/67 |
| 2007/0116872 A1 | 5/2007 | Li et al. | | |
| 2007/0187038 A1* | 8/2007 | Ren | H01J 37/32009 | 156/345.43 |
| 2007/0204797 A1* | 9/2007 | Fischer | C23C 16/4404 | 118/723 R |
| 2007/0209588 A1* | 9/2007 | Li | C23C 16/4412 | 118/715 |
| 2007/0209590 A1* | 9/2007 | Li | C23C 16/4409 | 118/719 |
| 2007/0227666 A1* | 10/2007 | Matsumoto | C23C 16/45565 | 156/345.47 |
| 2007/0235660 A1* | 10/2007 | Hudson | H01J 37/32082 | 250/423 P |
| 2007/0284045 A1* | 12/2007 | Fischer | H01J 37/32082 | 156/345.43 |
| 2007/0284246 A1* | 12/2007 | Keil | C23C 16/509 | 204/298.36 |
| 2008/0020574 A1* | 1/2008 | Marakhtanov | H01J 37/32091 | 438/689 |
| 2008/0087641 A1* | 4/2008 | De La Llera | H01J 37/32009 | 216/67 |
| 2008/0090417 A1* | 4/2008 | De La Llera | H01J 37/32009 | 438/689 |
| 2008/0099120 A1* | 5/2008 | Larson | H01J 37/32009 | 156/1 |
| 2008/0099448 A1* | 5/2008 | Larson | H01J 37/32009 | 219/121.43 |
| 2008/0141941 A1* | 6/2008 | Augustino | C23C 16/45565 | 118/723 R |
| 2008/0149596 A1* | 6/2008 | Dhindsa | H01J 37/3244 | 216/67 |
| 2008/0179297 A1* | 7/2008 | Bailey | H01J 37/32366 | 219/69.15 |
| 2008/0241420 A1* | 10/2008 | Dhindsa | H01J 37/32091 | 427/569 |
| 2008/0308228 A1* | 12/2008 | Stevenson | H01J 37/32091 | 156/345.34 |
| 2009/0044751 A1* | 2/2009 | Park | H01J 37/32495 | 118/723 E |
| 2009/0081878 A1* | 3/2009 | Dhindsa | H01J 37/32091 | 438/729 |
| 2009/0127234 A1* | 5/2009 | Larson | H01J 37/32009 | 219/121.43 |
| 2009/0163034 A1* | 6/2009 | Larson | B29C 65/5071 | 438/729 |
| 2009/0200269 A1* | 8/2009 | Kadkhodayan | C23C 14/564 | 216/71 |
| 2009/0305509 A1* | 12/2009 | Stevenson | C23C 16/45565 | 438/710 |
| 2010/0003824 A1* | 1/2010 | Kadkhodayan | H01J 37/32091 | 438/710 |
| 2010/0003829 A1* | 1/2010 | Patrick | C23C 16/4557 | 438/758 |
| 2010/0159703 A1* | 6/2010 | Fischer | H01J 37/32091 | 438/710 |
| 2010/0184298 A1* | 7/2010 | Dhindsa | H01J 37/3244 | 438/710 |
| 2010/0263592 A1* | 10/2010 | Kholodenko | H01J 37/32091 | 118/723 E |
| 2011/0011534 A1* | 1/2011 | Dhindsa | H01J 37/32091 | 156/345.43 |
| 2011/0021031 A1* | 1/2011 | Taylor | C04B 35/593 | 438/724 |
| 2011/0070740 A1* | 3/2011 | Bettencourt | H01J 37/3244 | 438/710 |
| 2011/0070743 A1* | 3/2011 | Dhindsa | H01J 37/32091 | 438/725 |
| 2011/0083318 A1* | 4/2011 | Larson | H01J 37/32009 | 29/592.1 |
| 2011/0104884 A1* | 5/2011 | Koshiishi | H01J 37/20 | 438/597 |
| 2011/0240222 A1* | 10/2011 | Sawada | H01J 37/321 | 156/345.28 |
| 2012/0006488 A1* | 1/2012 | Murakami | H01J 37/32642 | 156/345.29 |
| 2012/0247673 A1* | 10/2012 | Hayashi | H01J 37/32449 | 156/345.33 |
| 2013/0126486 A1* | 5/2013 | Bise | H01J 37/3244 | 219/121.48 |
| 2013/0206337 A1* | 8/2013 | Dhindsa | H01J 37/32091 | 156/345.28 |
| 2014/0007413 A1* | 1/2014 | Hudson | H01J 37/32082 | 29/592.1 |
| 2014/0034243 A1* | 2/2014 | Dhindsa | H01J 37/32091 | 156/345.51 |

FOREIGN PATENT DOCUMENTS

| | | |
|---|---|---|
| JP | H09-055374 A | 2/1997 |
| JP | 2000164392 A * | 6/2000 |
| JP | 2001-230237 | 8/2001 |
| JP | 2004-119448 | 4/2004 |
| JP | 2004-311066 A | 11/2004 |

(56) References Cited

FOREIGN PATENT DOCUMENTS

| | | |
|---|---|---|
| JP | 2007-520059 A | 7/2007 |
| JP | 2011-515828 | 5/2011 |
| TW | 434745 | 5/2001 |
| TW | 516123 | 1/2003 |
| TW | 200708207 | 2/2007 |
| TW | 200824506 | 6/2008 |
| TW | 200845091 | 11/2008 |
| TW | 200847268 | 12/2008 |
| WO | WO02/31859 A2 | 4/2002 |
| WO | WO 02/031859 A3 | 4/2002 |
| WO | WO2007/001865 A2 | 1/2007 |
| WO | WO2008/082518 A2 | 7/2008 |
| WO | WO 2008/082518 A3 | 7/2008 |
| WO | WO2009/100289 A2 | 8/2009 |
| WO | WO 2009/100289 A3 | 8/2009 |
| WO | WO2009/100345 A2 | 8/2009 |
| WO | WO 2009/100345 A3 | 8/2009 |

OTHER PUBLICATIONS

Taiwanese Office Action from Taiwanese Application No. 098143679 dated Nov. 10, 2015.
European Supplementary Search Report dated Mar. 18, 2015 from European Application No. EP09837887.
Japanese Office Action dated Dec. 2, 2014 from Japanese Application No. 2011-542362.
Taiwan Search Report dated Mar. 2, 2015 from Taiwan Patent Application No. 098143679.
International Preliminary Report on Patentability, Issued in PCT Application No. PCT/US2009/068183; Mailing Date: Jun. 30, 2011.
Office Action dated Nov. 8, 2012 from U.S. Appl. No. 12/368,843.
Final Office Action dated Apr. 30, 2013 from U.S. Appl. No. 12/368,843.
Office Action dated Feb. 25, 2014 from U.S. Appl. No. 12/368,843.
Notice of Allowance dated Jun. 24, 2014 from U.S. Appl. No. 12/368,843.

* cited by examiner

METHODS AND APPARATUS FOR DUAL CONFINEMENT AND ULTRA-HIGH PRESSURE IN AN ADJUSTABLE GAP PLASMA CHAMBER

CROSS REFERENCE TO RELATED APPLICATIONS

This divisional application claims priority to co-pending U.S. patent application Ser. No. 12/368,843, filed Feb. 10, 2009, entitled "METHODS AND APPARATUS FOR DUAL CONFINEMENT AND ULTRA-HIGH PRESSURE IN AN ADJUSTABLE GAP PLASMA CHAMBER," which claims priority from U.S. Provisional Application No. 61/139,481, filed on Dec. 19, 2008, all of which are incorporated herein by reference in its entirety for all purposes.

BACKGROUND OF THE INVENTION

Advances in plasma processing have facilitated growth in the semiconductor industry. The semiconductor industry is a highly competitive market. The ability for a manufacturing company to be able to process substrates in different processing conditions may give the manufacturing company an edge over competitors. Thus, manufacturing companies have dedicated time and resources to identify methods and/or arrangements for improving substrate processing.

A typical processing system that may be employed to perform substrate processing may be a capacitively-coupled plasma (CCP) processing system. The plasma processing system may be built to enable processing in a range of process parameters. However, in recent years, the types of devices that may be processed have become more sophisticated and may require more precise process control. For example, devices being processed are becoming smaller with finer features and may require more precise control of plasma parameters, such as plasma density and uniformity across the substrate, for better yield. Pressure control of the wafer area in the etching chamber may be an example of a process parameter affecting plasma density and uniformity.

The manufacturing of semiconductor devices may require multi-step processes employing plasma within a plasma processing chamber. During plasma processing of semiconductor device(s), the plasma processing chamber may typically be maintained at a predefined pressure for each step of the process. The predefined pressure may be achieved through employing mechanical vacuum pump(s), turbo pump(s), confinement ring positioning and/or combinations thereof, as is well known by those skilled in the art.

Conventionally, a valve assembly may be employed to throttle the exhaust turbo pump(s) to attain pressure control for maintaining predefined pressure conditions in the plasma processing chamber. However, the pressure being controlled by the vat valve may result in a global change in the entire chamber without the capability of providing differential pressure control in different regions of the chamber.

In the prior art, the pressure in the plasma generating region of the plasma processing chamber (e.g., the region encapsulated by the two electrodes and surrounded by the confinement rings) may be controlled by adjusting the gaps between the confinement rings of a confinement ring assembly. Adjusting the gaps controls the flow rate of exhaust gas from the plasma generating region and pressure may be affected as a result. The overall gas flow conductance out of the plasma generating region may depend on several factors, including but not limited to, the number of confinement rings and the size of the gaps between the confinement rings. Thus, the operating windows for the pressure range may be limited by the chamber gap and/or the gaps of these confinement rings. Furthermore, the plasma cross section may be a fixed diameter for the aforementioned process due to the fix diameter of these confinement rings.

In the prior art, a plasma processing chamber configured with the capability to sustain a plurality of differentiated plasma volumes may be employed to address the aforementioned problem of plasma of fixed cross section. In an example, a wide-gap configuration may be employed to provide an increased plasma cross section with relatively low pressure. In another example, a narrow-gap configuration may be employed to provide the conventional plasma cross section but relatively higher pressure may be attained. However, active differentiated pressure control for the system is not provided.

In view of the need to process the substrate in multiple steps, each of which may involve a different pressure, improvement to the capability to provide differentiated pressure control over a wider range of pressure in plasma processing systems is highly desirable.

SUMMARY OF INVENTION

The invention relates, in an embodiment, to a plasma processing system having a plasma processing chamber configured for processing a substrate. The plasma processing system includes at least an upper electrode and a lower electrode for processing the substrate. The substrate is disposed on the lower electrode during plasma processing, where the upper electrode and the substrate forms a first gap. The plasma processing system also includes an upper electrode peripheral extension (UE-PE). The UE-PE is mechanically coupled to a periphery of the upper electrode, where the UE-PE is configured to be non-coplanar with the upper electrode. The plasma processing system further includes a cover ring. The cover ring is configured to concentrically surround the lower electrode, where the UE-PE and the cover ring forms a second gap.

The above summary relates to only one of the many embodiments of the invention disclosed herein and is not intended to limit the scope of the invention, which is set forth is the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
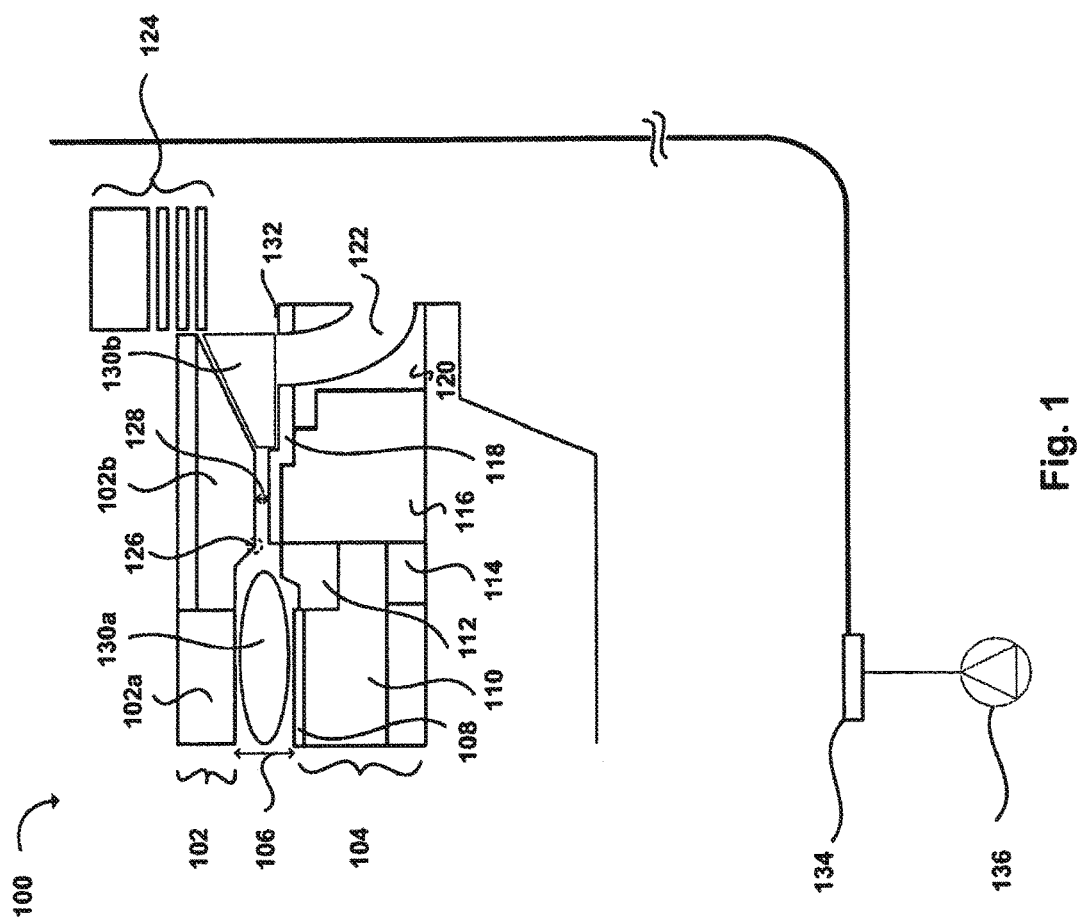
FIG. 1 shows, in accordance with an embodiment of the present invention, a simplified schematic of a plasma processing system configured with an adjustable gap between an upper electrode assembly and a lower electrode assembly to yield a narrow gap configuration with a symmetric chamber for ultra-high pressure and/or low conductance regime.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with embodiments of the invention, there are provided methods and apparatus for providing a wide range of pressure in the same plasma processing chamber. In some plasma processing systems, the chamber gap (i.e., the gap between the upper and lower electrode) is a recipe parameter and may vary from step to step. In these plasma processing systems, there may be provided a mechanism configured to move the lower electrode assembly to adjust the chamber gap. In other plasma processing systems, the upper electrode assembly may be moved. In the disclosure herein, the chamber is assumed to have a moving lower electrode. It should be understood, however, that embodiments of the invention herein apply equally well to chambers in which the upper electrode is movable (alternatively or additionally).

In one ore more embodiments, the upper electrode is grounded while the lower electrode is powered. In an implementation, the periphery of the upper electrode is provided with an annular, i.e., donut-shaped, ring that surrounds the upper electrode. The annular extension is referred herein as the upper electrode peripheral extension (UE-PE).

The gap below the UE-PE is to a quartz cover ring may be configured such that as the gap between the upper electrode and the lower electrode is sufficiently narrowed, there comes a point where the gap below the UE-PE is insufficiently large to sustain plasma below the UE-PE while the gap that under lies the upper electrode inside of the UE-PE still remain sufficiently large to sustain plasma. In this narrow-gap case, the gap below UE-PE may represent an area of very high flow restriction. In an embodiment, the height of the gap below UE-PE may be adjusted to control the pressure to attain ultra-high pressure and low conductance in the area of the gap that under lies the upper electrode inside of the UE-PE.

As the gap between the upper electrode and the lower electrode is gradually enlarged whereas the gap below the UE-PE is insufficiently large to sustain plasma while the gap that under lies the upper electrode inside of the UE-PE still remain sufficiently large to sustain plasma, lower pressure and higher conductance may be achieved for the narrow-gap configuration in an embodiment.

As the gap between the upper electrode and the lower electrode is further gradually enlarged, there comes a point where the gap below the UE-PE is sufficiently large to sustain plasma while the gap that under lies the upper electrode inside of the UE-PE is also sufficiently large to sustain plasma. In this wide-gap configuration, low pressure and high conductance may be achieved. The confinement rings may be employed to contain plasma and/or control pressure.

As may be appreciated from the foregoing, the effective RF coupling area of the powered lower electrode remains the same for both the narrow-gap configuration and the wide-gap configuration. However, in the wide-gap configuration, the effective RF coupling area of the grounded electrode is enlarged. Accordingly, the narrow-gap configuration may provide for a first area ratio of RF coupling while the wide-gap configuration may provide for a second area ratio of RF coupling, i.e., larger due to a larger effective RF ground coupling area.

In an embodiment, the difference in gaps (i.e., the gap between the upper electrode and lower electrode at the central region of the upper electrode and the gap below the UE-PE) may be accomplished by making the UE-PE non co-planar with the upper electrode. For example, the UE-PE may protrude below the upper electrode. The UE-PE moves together with the upper electrode in implementation wherein the upper electrode is movable.

In another embodiment, a lower electrode periphery extension (LE-PE) may be employed to be non-coplanar with the lower electrode. For example, the LE-PE may be raised above the electrode. In an example, the LE-PE may be quartz cover ring. The LE-PE moves together with the lower electrode in implementation wherein the lower electrode is movable.

The features and advantages of the present invention may be better understood with reference to the figures and discussions (with prior art mechanisms and embodiments of the invention contrasted) that follow.

FIG. 1 shows, in accordance with an embodiment of the present invention, a simplified schematic of a plasma processing system configured with an adjustable gap between an upper electrode assembly and a lower electrode assembly to yield a narrow gap configuration with a symmetric chamber for ultra-high pressure and/or low conductance regime. Plasma processing system 100 may be a single, double or triple frequency capacitively discharged system or may be an inductively coupled plasma system or a plasma system employing a different plasma generating and/or sustaining technology. In the example of FIG. 1, radio frequency may include, but are not limited to, 2, 27 and 60 MHz.

Referring to FIG. 1, plasma processing system 100 may be configured with an upper electrode assembly 102 and a lower electrode assembly 104, in an embodiment. The upper electrode assembly 102 and lower electrode assembly 104 may be separated from each other by a chamber gap 106. The upper electrode assembly 102 may include at least an upper electrode that may be grounded or powered by an RF power supply (not shown).

In the example of FIG. 1, upper electrode assembly 102 may be grounded in an embodiment. Further, upper electrode assembly 102 may be configured with an inner upper electrode component 102a and an outer upper electrode component 102b in an embodiment. Outer electrode component 102b may be an annular extension of inner upper electrode 102a in an embodiment. Herein, outer electrode component 102b may be referred to as an upper electrode peripheral extension (UE-PE).

Figure 2:
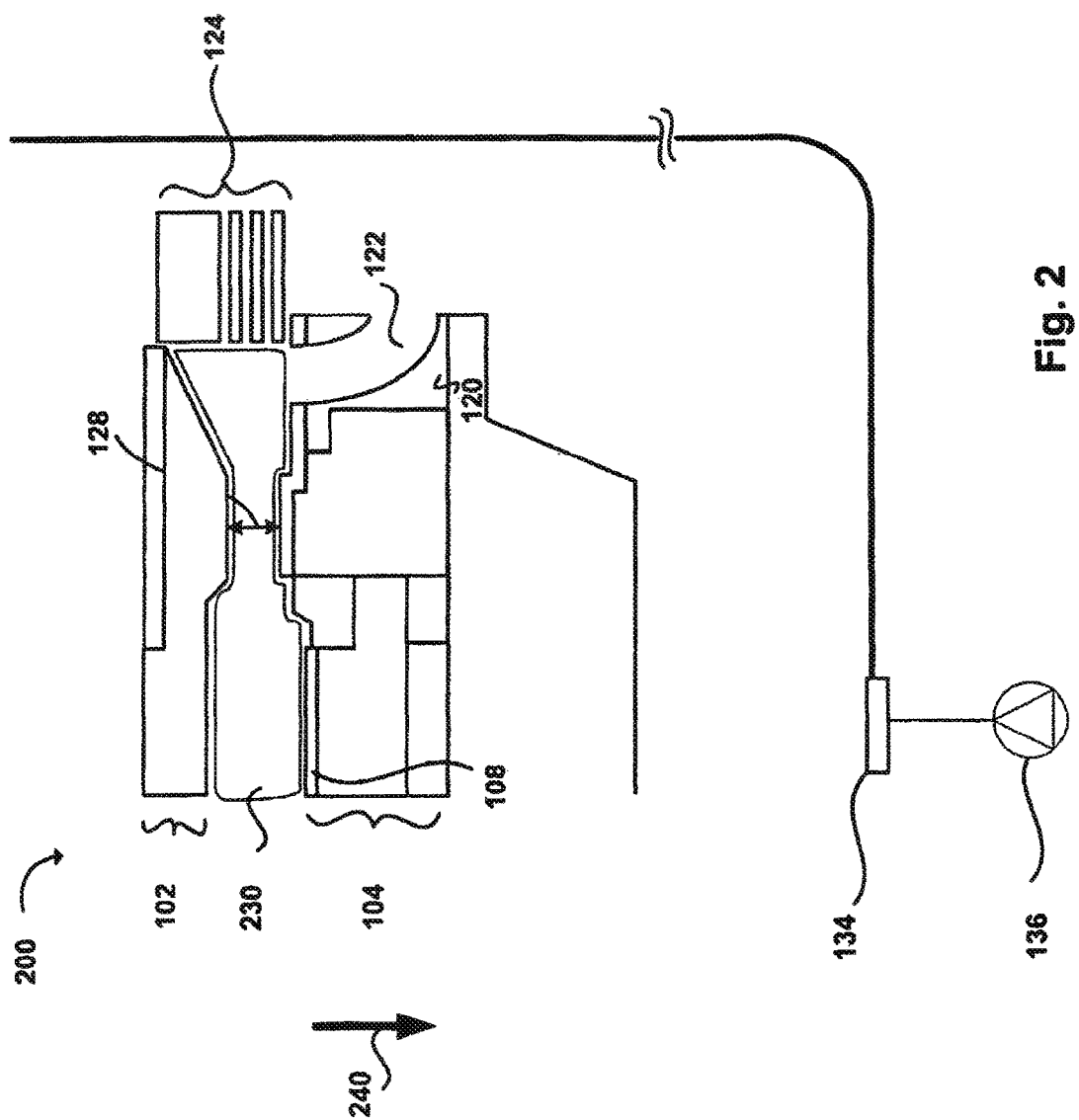
FIG. 2 shows, in accordance with an embodiment of the present invention, a simplified schematic of a plasma processing system configured with an adjustable gap between an upper electrode assembly and a lower electrode assembly to yield a wide gap configuration with an asymmetric chamber for low pressure and/or high conductance regime.

As shown in FIG. 1, inner upper electrode component 102a and UE-PE 102b may be formed from different components as shown in FIG. 1. Alternatively, inner upper electrode 102a and UE-PE 102b may be formed as a monolithic unit in an embodiment as shown in FIG. 2. Further, inner upper electrode 102a and/or UE-PE 102b may be formed from a plurality of components in an embodiment.

Lower electrode assembly 104 may be configured with an electrostatic chuck (ESC) 110, an edge ring 112, an insulator ring 114, a focus ring 116, a quartz cover ring 118, confinement ring assembly 124, and/or a by-pass ring 120 in an embodiment. As shown in FIG. 1, by-pass ring 120 may be formed from aluminum. In an embodiment, by-pass ring 120 may be configured with a by-pass cavity 122 to allow gas to exhaust through by-pass cavity 122. As shown in FIG. 1, a vat valve 134 coupled to a turbo molecular pump (TMP) 136 may be employed to exhaust processed gas from plasma processing system 100. The features of the aforementioned components are well known by those skilled in the art and will not be discussed in detail to simplify the discussion.

In an embodiment, UE-PE 102*b* may be configured with a step, i.e., choke point 126. As a result of the step, the lower surface of UE-PE 102*b* may extend or protrude below the lower surface of inner upper electrode 102*a*. As shown in FIG. 1, the lower surface of UE-PE 102*b* and the top surface of quartz cover ring 118 may be separated by a second gap 128 in an embodiment. The size of gap 128 may be adjustable by moving upper electrode assembly 102 and/or lower electrode assembly in an embodiment.

In an embodiment, the choke point may be formed by making a non co-planar step. For example, the UE-PE may extend or protrude below the surface of the upper electrode. Alternatively or additionally, a lower electrode periphery extension (LE-PE) may be employed to be non-coplanar with the lower electrode. For example, the LE-PE may be raised above the electrode. In an example, the LE-PE may be quartz cover ring 118.

As shown in FIG. 1, plasma processing system 100 may be configured with two possible plasma sustaining regions: region 130*a* OR regions 130*a* plus 128 plus 130*b*. In an embodiment, region 130*a* may be capable of sustaining plasma whenever chamber gap 106 is sufficiently large to sustain plasma. Whereas, regions 130*a* plus 128 plus 130*b* may be capable of sustaining plasma whenever gap 128 in the choke region is sufficiently large to sustain plasma in an embodiment. This is depicted in FIG. 2.

During plasma processing, processed gas (not shown) may be supplied into chamber gap 106. The processed gas being supplied into chamber gap 106 may be excited into a plasma state by RF power supplied to lower electrode assembly 104. Consider the situation wherein, for example, lower electrode assembly 104 may be moved to create a narrow-gap configuration wherein the size of gap 128 may be insufficient large (relative to the mean free path) to sustain plasma.

In the narrow-gap configuration of FIG. 1, plasma may be sustained in region 130*a* of chamber gap 106 in an embodiment. Gap 128 of choke region may be insufficiently large to sustain plasma. Therefore, region 130*b* may be incapable of sustaining plasma. In the narrow gap configuration confinement ring assembly 124 is pulled up to limit additional flow obstructions.

In an embodiment, the upper electrode and lower electrode may be sized such that in the narrow-gap configuration, a 1:1 area ratio may be achieved, making the chamber a symmetric chamber in the narrow-gap configuration.

In the narrow-gap configuration, differential pressure between region 130*a* and the rest of plasma processing system may be attained and controlled in an embodiment. In an example, the pressure in chamber gap 106 may be controlled by an active feedback loop. In an embodiment, the pressure in region 130*a* may be measured and gap 128, vat valve 134 and/or gas flow rate may be adjusted to control the pressure in region 130*a*.

Consider the situation wherein, for example, ultra-high pressure, e.g., in the Torr range, may be desired in region 130*a* during plasma processing of a substrate 108. Lower electrode assembly 104 may be moved to a reduced height to form a very narrow gap for gap 128. The choke region of gap 128 may represent an area of very high flow restriction choking the gas flow significantly. In an embodiment, the height of gap 128 is insufficiently large to sustain plasma in gap 128 and/or region 130*b*.

Through the aforementioned active pressure feedback loop, pressure in region 130*a* may be controlled by adjusting the height of gap 128. For example, the pressure in region 130*a* may be increased by further reducing the height of gap 128. In an embodiment, gap 128 remains insufficiently large to sustain plasma in region 130*b* throughout the range of pressure controlled through adjusting gap 128.

Alternatively and/or additionally, the pressure in region 130*a* may be controlled by adjusting the flow of processed gas through region 130*a* in an embodiment. In an example, the flow of processed gas may be increased to increase pressure in region 130*a* to increase pressure to attain ultra-high pressure in region 130*a*.

Alternatively and/or additionally, pressure control of region 130*a* may be achieved by adjusting vat valve 134 upstream of TMP 136 in an embodiment. In an example, vat valve 134 may be throttle closed to back pressure plasma chamber region to increase pressure to attain ultra-high pressure in region 130*a*.

Referring to FIG. 1, a confinement ring set 124 may not be employed in pressure control for ultra-high pressure regime because flow restriction is insignificant in comparison to the flow restriction from gap 128. In addition, confinement ring set 124 is parallel of by-pass ring 120, which has even higher conductance than the gaps between confinement ring set 124. For example, confinement ring set 124 may be configured in the collapsed state resting on shoulder 132 of by-pass ring 120 or may be pulled up into the wafer transport position as shown in FIG. 1. Gas conductance through by-pass cavity 122 of by-pass ring 120 may render pressure control from confinement ring set 124 inconsequential.

Accordingly, region 130*a* may be able to attain ultra-high pressure, e.g., up to about 5 Torr, due to the high flow rate and/or the high flow restriction. Thus, a symmetric chamber with a narrow gap configuration may attain ultra-high pressure and/or low conductance independent of the rest of the processing chamber in an embodiment.

In the prior art, gap 128 may be employed to extinguish plasma in region 130*b* by narrowing the size of gap 128 to be insufficient large to sustain plasma. In contrast, gap 128 may be employed not only to extinguish plasma in region 130*b*, but gap 128 may be adjusted to control pressure in region 130*b*. Thus, gap 128 may be narrowed beyond the point to extinguish plasma for pressure control.

Consider another situation wherein, for example, low pressure and/or high conductance may be desired in region 130*a* during plasma processing for the configuration with a symmetric chamber and narrow gap. FIG. 1 is employed to illustrate the example of low pressure and/or high conductance regime with the symmetric chamber. For example, lower electrode assembly 104 may be moved such that gap 128 is sufficiently large to reduce flow restriction but still able to prevent plasma ignition in region 130*b* in an embodiment.

Referring to FIG. 1, plasma is sustained in region 130*a*. Gap 128 is sufficiently narrowed to extinguish plasma, and plasma is not sustained in region 130*b*. In an embodiment, gap 128 may be sufficiently large to increase gas conductance resulting in lower pressure in region 130*a*. In an embodiment, pressure control of region 130*a* may be attained by adjusting gap 128. The upper range for the size of gap 128 may be limited to the size of gap 128 (relative to the mean free path) to sustain plasma in an embodiment.

Alternatively and/or additionally, the pressure in region 130a may be controlled by adjusting the flow of processed gas through region 130a in an embodiment. In an example, the flow of processed gas may be reduced to decrease pressure in region 130a.

Alternatively and/or additionally, pressure control of region 130a may be achieved by adjusting vat valve 134 upstream of TMP 136 in an embodiment. In an example, vat valve 134 may be throttle opened to reduce pressure in region 130a.

In the low pressure regime with the symmetric chamber, confinement ring set 124 may be employed to control pressure. Referring to FIG. 1, confinement ring set 124 may be lowered and pressure in region 130a may be controlled by adjusting the gaps between confinement ring set 124. Methods for controlling pressure employing confinement ring set is well known by those skilled in the art and is not discussed in detail to simplify discussion.

Accordingly, a lower pressure regime may be achieved with symmetric chamber configuration by adjusting gap 128 to increase conductance while preventing external region 130b from sustaining plasma. Pressure in region 130a may be controlled by adjusting gap 128, confinement ring set 124, gas flow rate, and/or vat valve 134.

FIG. 2 shows, in accordance with an embodiment of the present invention, a simplified schematic of a plasma processing system configured with an adjustable gap between an upper electrode assembly 102 and a lower electrode assembly 104 to yield a wide gap configuration with an asymmetric chamber for low pressure and/or high conductance regime. FIG. 2 is discussed in relation to FIG. 1 to facilitate understanding.

Consider the situation wherein, for example, low pressure, e.g., as low as about 5 mili-Torr, may be desired for processing of substrate 108 in plasma processing system 200, as shown in FIG. 2. The low pressure and/or high conductance may be attained by moving lower electrode assembly 104 in the direction of an arrow 240 to increase the height of gap 128 in an embodiment. The increase in height of gap 128 may result in higher conductance. In an embodiment, gap 128 is sufficiently large and plasma may be sustained in a region 230. Region 230 may extend from the center of the chamber out to the inner edge of confinement ring set 124. As shown in FIG. 2, confinement ring set 124 may be employed to confine plasma within a specific region.

In the wide-gap configuration of FIG. 2, the area ratio of the grounded upper electrode to the powered lower electrode may be high, i.e., the ratio may be greater than 1:1, making the chamber asymmetric. In contrast to the symmetric configuration, plasma is sustained in region 230 for the asymmetric configuration as shown in FIG. 2 instead of plasma being only sustained in region 130a as shown in FIG. 1. For example, a high ratio of ground to powered RF electrode areas may result in high bias voltage and high ion energy at substrate 108 for the wide-gap configuration.

As shown in FIG. 2, gas may flow out of region 230 through by-pass cavity 122 of by-pass ring 120 contributing to the capability of attaining low pressure for the asymmetric configuration. Due to by-pass cavity 122 and the increased height of gap 128, the high pressure that may be attained in the asymmetric configuration may be limited.

In the low pressure asymmetric configuration, pressure in region 230 may be controlled by adjusting the gaps of confinement ring set 124, as shown in FIG. 2. Confinement ring set 124 may be lowered and pressure may be controlled by adjusting the gaps between confinement ring set 124.

Alternatively and/or additionally, the pressure in region 230 may be controlled by adjusting the flow of processed gas through region 130 in an embodiment. In an example, the flow of processed gas may be reduced to decrease pressure in region 230.

Alternatively and/or additionally, pressure control of region 230 may be achieved by adjusting vat valve 134 upstream of TMP 136 in an embodiment. In an example, vat valve 134 may be throttle opened to reduce pressure in region 230.

Accordingly, a lower pressure regime with increased conductance may be achieved in a wide-gap configuration of gap 128 with an asymmetric chamber. Pressure in region 230 may be controlled by adjusting gaps between the confinement ring set 124, gas flow rate, and/or vat valve 134.

As can be appreciated from the foregoing, embodiments of the invention permit differentiated pressure control to provide a wide range of pressure and/or conductance in a plasma processing system. The range of pressure that may be attained may be from about 5 mili-Torr to about 5 Torr. In the ultra-high pressure range, plasma processing in the gamma mode may be possible. Furthermore, the different gap configurations may allow for control of grounded upper electrode to powered lower electrode area ratio allowing control of wafer bias and ion energy as well as ion energy distribution. Thus, substrate requiring various recipes over a wide range of pressure and/or bias and ion energy or ion energy distribution may be performed using the same plasma processing chamber reducing cost and/or time delay that may incur in employing multiple plasma processing chambers.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the invention. It is therefore intended that the invention be interpreted as including all such alterations, permutations, and equivalents as fall within the true spirit and scope of the present invention.

What is claimed is:

1. A method for controlling pressure in a plasma processing chamber, said method comprising:

providing at least an upper electrode and a lower electrode for processing a substrate, said substrate being disposed on said lower electrode during plasma processing, where said upper electrode and said substrate forms a first gap, wherein said upper electrode is grounded and wherein said lower electrode is powered;

providing an upper electrode peripheral extension (UE-PE), said UE-PE is mechanically coupled to a periphery of said upper electrode, where said UE-PE is also grounded and configured to be non-coplanar with said upper electrode;

providing a cover ring formed of quartz that surrounds said lower electrode, where a lower surface of said UE-PE and an upper surface of said cover ring forms a second gap, wherein said second gap is smaller than said first gap and wherein one of said upper electrode, along with said UE-PE, and said lower electrode, along with said cover ring, is movable in a direction perpendicular to a planar surface of said lower electrode to form at least a first operating mode and a second operating mode whereby said second gap in said second operating mode is larger than said second gap in said first operating mode, said first operating mode characterized by having plasma in said first gap but not in said second gap and by a first RF coupling area ratio of grounded electrode area to powered electrode area, said second operating mode characterized by having plasma in said first gap and also plasma in said second gap and by a second RF coupling area ratio of grounded electrode area to powered electrode area that is larger than said first RF coupling area ratio;
generating a plasma within said plasma processing chamber to process said substrate; and
adjusting said second gap and said first gap to control pressure within said plasma processing chamber.

2. The method of claim 1, wherein said UE-PE and said upper electrode is formed as a monolithic unit.

3. The method of claim 1, wherein said UE-PE and said upper electrode is formed from a plurality of components.

4. The method of claim 1, wherein said plasma processing chamber further includes a set confinement ring, said method including:
deploying said set of confinement rings to regulate a process pressure when said first gap exists between said upper electrode and said lower electrode; and
completely stowing said set of confinement rings when said second gap exists between said upper electrode and said lower electrode due to said adjusting.

5. The method of claim 1, wherein said adjusting is in-situ.

6. The method of claim 1, wherein said adjusting includes moving one of said upper electrode and said lower electrode in a direction perpendicular to a planar surface of said lower electrode.

7. The method of claim 6, wherein only said upper electrode of said upper electrode and said lower electrode is adjustable.

8. The method of claim 6, wherein only said lower electrode of said upper electrode and said lower electrode is adjustable.

9. The method of claim 6, wherein said adjusting results in at least a first area ratio and a second area ratio, said first area ratio representing 1:1 and thereby emulating a symmetric plasma processing chamber, said second area ratio is other than 1:1 and thereby emulating a non-symmetric plasma processing chamber.

10. The method of claim 1, further comprising:
providing a by-pass ring having a by-pass cavity; and
evacuating at least a portion of exhaust gas produced by said processing.

11. A method for controlling pressure in a capacitively coupled plasma processing chamber, said method comprising:
providing a grounded upper electrode;
providing a powered lower electrode for supporting a substrate during a processing, said lower electrode being movable in a direction perpendicular to a planar surface of said substrate when said substrate is disposed on said lower electrode, whereby said upper electrode and said substrate forms a first gap;
providing a cover ring formed of quartz that surrounds said lower electrode, said cover ring moving together with said lower electrode; and providing a grounded upper electrode peripheral extension (UE-PE) configured to concentrically surround said upper electrode and is fixed relative to said upper electrode, whereby at least a portion of a lower surface of said UE-PE is configured to be non-coplanar with a lower surface of said upper electrode, whereby said at least a portion of said lower surface of said UE-PE and an upper surface of said cover ring forms a second gap and whereby said second gap is narrower than said first gap irrespective of a position of said movable lower electrode, wherein said lower electrode is movable to create at least a first plasma mode and a second plasma mode, said first plasma mode having both said first gap and said second gap capable of sustaining a plasma therein and is characterized by a first RF coupling area ratio of grounded electrode area to powered electrode area, said second plasma mode having said first gap having a height capable of sustaining said plasma in said first gap and said second gap having a height too narrow to sustain said plasma in said second gap and is characterized by a second RF coupling area ratio of grounded electrode area to powered electrode area that is smaller than said first RF coupling area ratio;
generating a plasma within said capacitively coupled plasma processing chamber to process said substrate; and
adjusting said second gap and said first gap to control pressure within said capacitively coupled plasma processing chamber.

12. The method of claim 11, wherein said lower electrode position is variable while in said first plasma mode, thereby sustaining said plasma in said first gap and said second gap for a plurality of lower electrode positions.

13. A method for controlling pressure in a capacitively coupled plasma processing chamber, said method comprising:
providing at least an upper electrode and a lower electrode for processing said substrate, said substrate being disposed on said lower electrode during plasma processing, where said upper electrode and said substrate forms a first gap, wherein said upper electrode is grounded and wherein said lower electrode is powered;
providing an upper electrode peripheral extension (UE-PE), said UE-PE is mechanically coupled to a periphery of said upper electrode, where said UE-PE is also grounded; and
providing a cover ring formed of quartz that surrounds said lower electrode, wherein an upper surface of said cover ring is non-coplanar relative to an upper surface of said lower electrode, a lower surface of said UE-PE and an upper surface of said cover ring forms a second gap, wherein said second gap is smaller than said first gap and wherein one of said upper electrode, along with said UE-PE, and said lower electrode, along with said cover ring, is movable in a direction perpendicular to a planar surface of said lower electrode to form at least a first operating mode and a second operating mode whereby said second gap in said second operating mode is larger than said second gap in said first operating mode, said first operating mode characterized by having plasma in said first gap but not in said second gap and by a first RF coupling area ratio of grounded electrode area to powered electrode area, said second operating mode characterized by having plasma in said first gap and also plasma in said second gap and by a second RF coupling area ratio of grounded electrode area to powered electrode area that is larger than said first RF coupling area ratio;

generating a plasma within said capacitively coupled plasma processing chamber to process said substrate; and adjusting said second gap and said first gap to control pressure within said capacitively coupled plasma processing chamber.

14. The method of claim 13, wherein the lower surface of UE-PE slopes down at an angle from a point coplanar with the upper electrode to a point that is beneath a lower surface of the upper electrode.

15. The method of claim 13, wherein said first operating mode provides a narrow gap configuration with a symmetric chamber characterized by at least one of an ultra-high pressure or a low conductance regime.

16. The method of claim 13, wherein said second operating mode provides a wide gap configuration with an asymmetric chamber characterized by at least one of a low pressure or a high conductance regime.

* * * * *